(12) United States Patent
Boutros

(10) Patent No.: US 9,368,622 B1
(45) Date of Patent: Jun. 14, 2016

(54) STITCHED GATE GAN HEMTS

(75) Inventor: Karim S. Boutros, Moorpark, CA (US)

(73) Assignee: HRL Laboratories, LLC, Malibu, CA (US)

( * ) Notice: Subject to any disclaimer, the term of this patent is extended or adjusted under 35 U.S.C. 154(b) by 215 days.

(21) Appl. No.: 13/109,223

(22) Filed: May 17, 2011

Related U.S. Application Data

(60) Provisional application No. 61/351,669, filed on Jun. 4, 2010.

(51) Int. Cl.
*H01L 29/66* (2006.01)
*H01L 29/78* (2006.01)
*H01L 29/778* (2006.01)

(52) U.S. Cl.
CPC ...... *H01L 29/7831* (2013.01); *H01L 29/66462* (2013.01); *H01L 29/66484* (2013.01); *H01L 29/778* (2013.01); *H01L 29/7786* (2013.01)

(58) Field of Classification Search
CPC ............ H01L 29/7831; H01L 29/66484; H01L 21/82345; H01L 29/66462; H01L 29/778; H01L 21/28587; H01L 29/7786
USPC ........... 257/183, 192, 194, 153, 266, 270, 257/E29.246, E21.403, 319, 331, 341
See application file for complete search history.

(56) References Cited

U.S. PATENT DOCUMENTS

| | | | | |
|---|---|---|---|---|
| 4,977,435 A * | 12/1990 | Yoshimura et al. | ........... | 257/194 |
| 5,012,315 A * | 4/1991 | Shur | ............... | 257/365 |
| 5,270,557 A * | 12/1993 | Schmidt | ......... | 257/194 |
| 6,489,628 B1 * | 12/2002 | Morizuka | ........ | 257/12 |
| 6,507,051 B1 * | 1/2003 | Hara | ............... | 257/194 |

* cited by examiner

*Primary Examiner* — Jesse Y Miyoshi
(74) *Attorney, Agent, or Firm* — George R. Rapacki; Albert T. Wu

(57) ABSTRACT

Principles of the present invention reduces the maximum electric field strength between a gate and a source or drain in a FET by breaking up the usually monolithic gate into a plurality of physically separate subgates that are electrically connected into one or more groups.

13 Claims, 5 Drawing Sheets

Section A-A

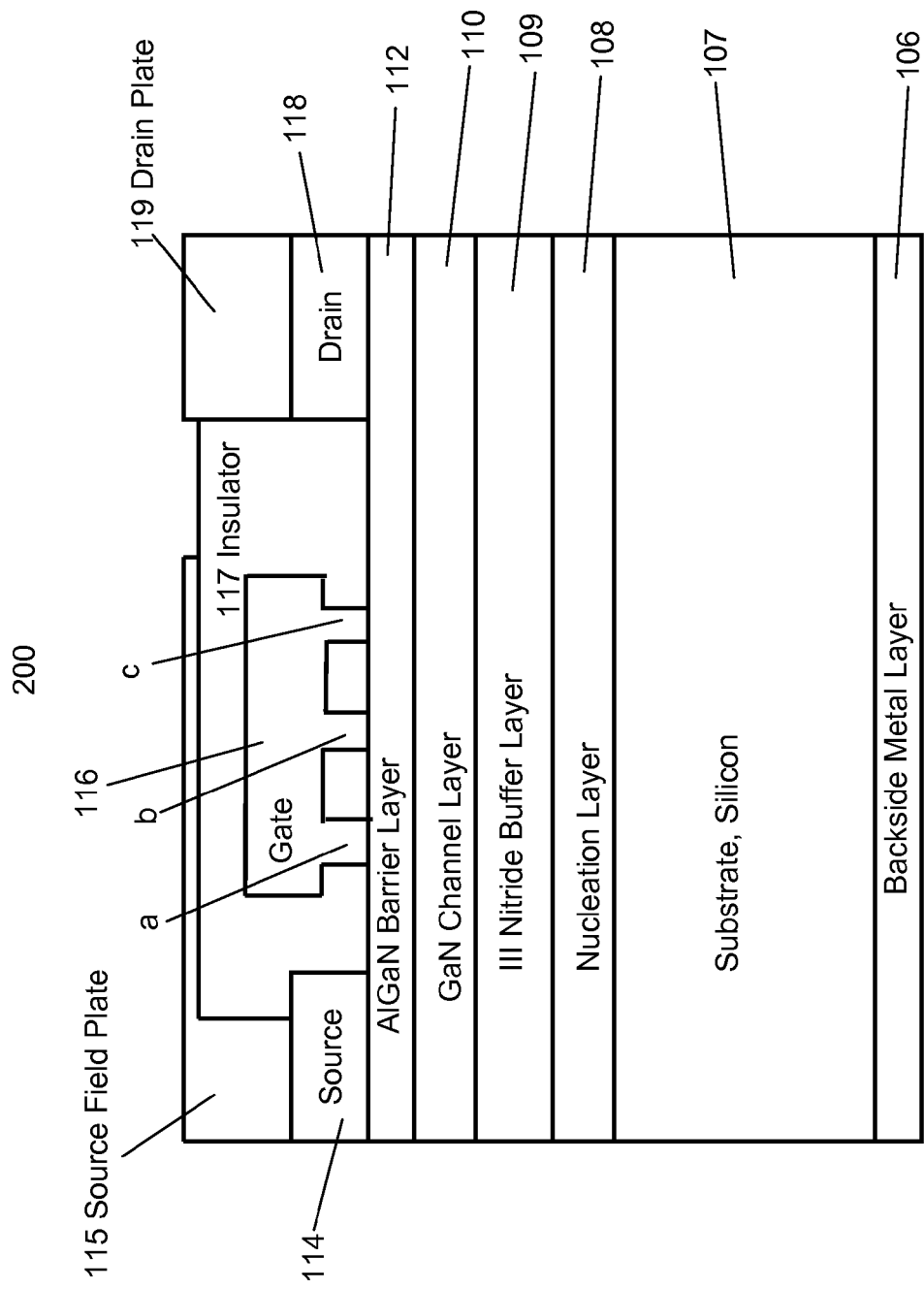

STITCHED GATE GAN HEMTS

This application claims priority to provisional application 61/351,669 filed Jun. 4, 2010 titled Stitched Gate GaN HEMTs. Provisional application 61/351,669 is incorporated by reference herein.

FIELD OF THE INVENTION

Principles of the present invention relate to the area of fabrication of Gallium Nitride High Electron Mobility Field Effect Transistors (HEMT), also known as heterostructure FETs (HFETs) or modulation-doped FETs (MODFETs), where the gate comprises a plurality of individual subgates.

BACKGROUND OF THE INVENTION

HEMT devices, particularly those made of GaN may be used to switch large voltages. One shortcoming of these devices is preventing short circuiting between the gate and drain through the barrier region. If the electric field between the gate and the drain in the barrier layer is too great the barrier layer breaks down and the device shorts.

SUMMARY OF THE INVENTION

This disclosure describes a structure and method to reduce the dynamic on resistance of a device and to increase the breakdown voltage between the gate and drain.

In one embodiment, the principles of the invention are embodied in a HEMT device comprising: a channel layer and a barrier layer; a source, gate and drain disposed on the barrier layer; wherein the gate may comprise a plurality of physically distinct subgates; and wherein the subgates are electrically connected into at least one group.

The previous embodiment may comprise subgates in rows separated by approximately 0.1 micrometer and each subgate is approximately 0.05 micrometer in radius. The subgates in each row may be separated laterally such that each row is staggered relative to an adjacent row of subgates. In addition the subgates are electrically connected with a field plate.

In another embodiment, the first embodiment wherein the channel layer comprises a Group III-V material and more specifically, the channel layer comprises GaN.

BRIEF DESCRIPTION OF THE DRAWINGS

The accompanying drawings, together with the specification, illustrate exemplary embodiments of the principles of the present invention, and serve to explain the principles of the present invention.

FIG. 5: Section A-A view of HEMT device showing a subgate.

Figure 1:
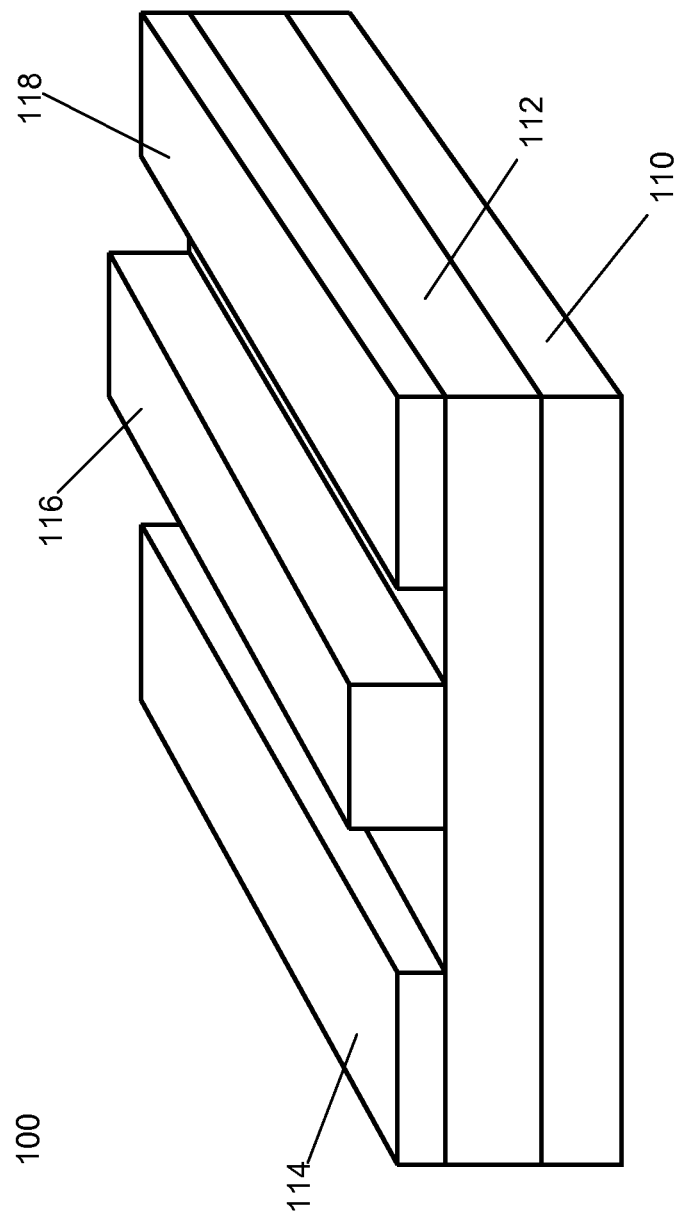
FIG. 1: Structure of prior art HEMTs showing monolithic gates.

The following papers are incorporated by reference as though fully set forth herein:

DETAILED DESCRIPTION

Although embodiments of the principles of the present invention are applicable to many different devices, they are particularly applicable to microwave and millimeter power GaN transistors and high-voltage switching GaN transistors.

In the following detailed description, only certain exemplary embodiments of the principles of the present invention are shown and described, by way of illustration. As those skilled in the art would recognize, the described exemplary embodiments may be modified in various ways, all without departing from the spirit or scope of the present invention. Accordingly, the drawings and description are to be regarded as illustrative in nature, and not restrictive.

It is also understood that when an element such as a layer, region or substrate is referred to as being "on" another element, it can be directly on the other element or intervening elements may also be present. Furthermore, relative terms such as. "inner", "outer", "upper", "above", "lower", "beneath", "below", and similar terms., may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and or sections, these elements, components, regions, layers and or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of idealized embodiments of the invention. It is understood that many of the layers will have different relative thicknesses compared to those shown. Further, variations from the shapes of the illustrations as a result, for example, of manufacturing techniques and or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention. Like numbered elements are the same across figures, i.e. 116 in FIG. 1 is the same as 316 in FIG. 3.

FIG. 1 shows a typical perspective view of a FET device 100 comprising a channel layer 110, a barrier layer 112 plus the usual source 114, gate 116 and drain 118. Not shown are the buffer, nucleation and substrate layers. In general, the gate 116 in FIG. 1 is a single piece contacting the barrier layer 112 substantially over the entire extent of the gate 116. Other commonly know components of a HEMT are also omitted since a person skilled in the art would appreciate they do not distinguish the embodiments of the present invention from the prior art.

Figure 2:
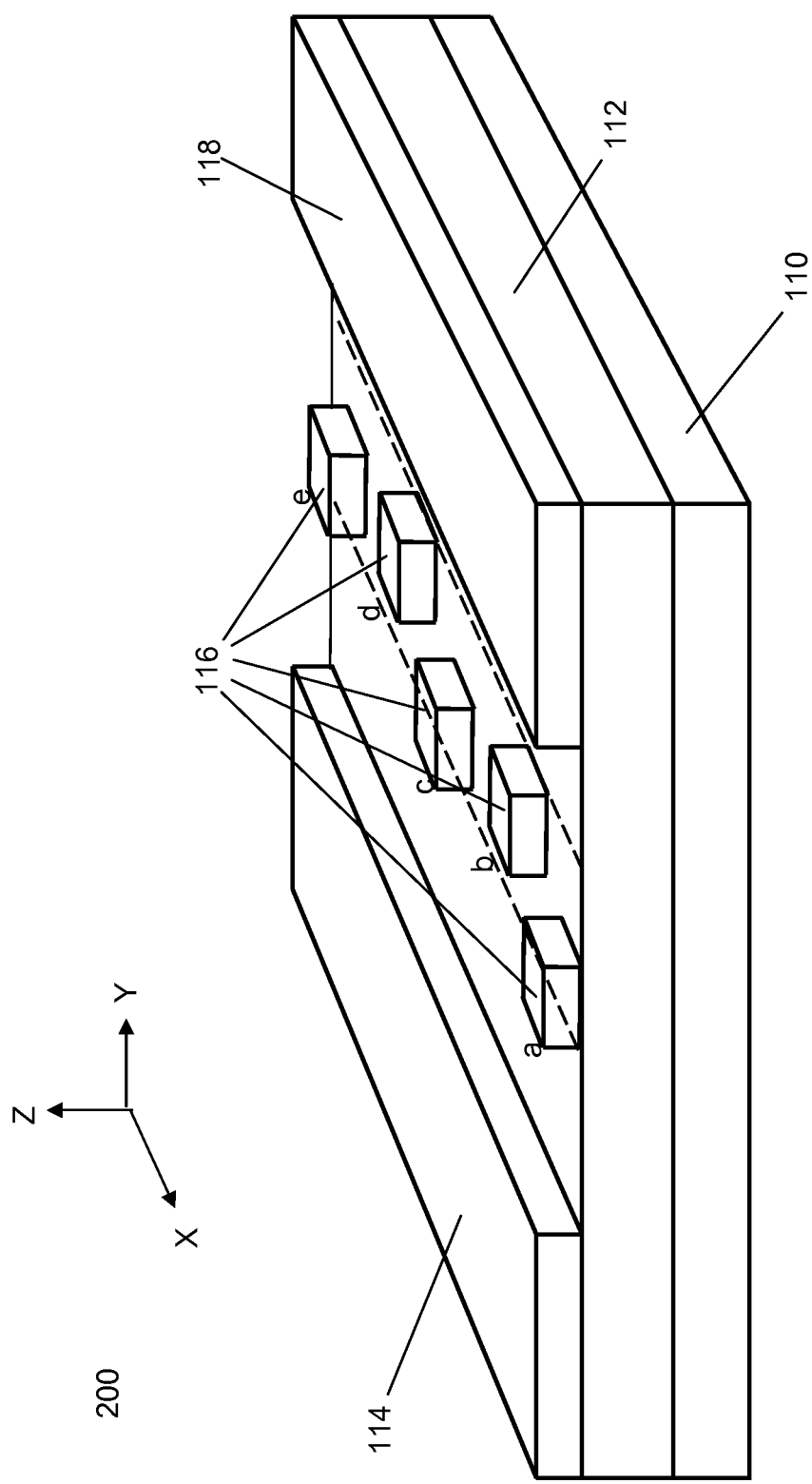
FIG. 2 Structure illustrating an embodiment of the present invention showing numerous subgates comprising the gate of the device.

In the prior art 100 the gate 116 typically consists of a single top gate structure only. This is in contrast to the embodiment of the principles of the present invention shown in FIG. 2. FIG. 2 shows the device 200 in perspective. The gate 116 is FIG. 2 consists of a plurality of physically separate subgate structures 116a-e each contacting the barrier layer. The subgates 116a-e in FIG. 2 may all be electrically connected in common by a single top metal field plate or groups of subgates 116a-e may be electrically connected into distinct clusters with two or more top metal field plates. This connection through a field plate is not shown in FIG. 2 for clarity and not to imply a limitation. The source 114, drain 118, barrier layer 112 and channel layer 110 are substantially the same as for FETs with monolithic gates.

In one preferred embodiment, the subgates 116*a-e* in FIG. 2 are spaced in staggered rows 0.1 micrometers apart and the subgates 116*a-e* are approximately 0.05 micrometers in radius. Non circular shaped subgates have an area substantially equal to the area of a 0.05 micrometer radius circle. Although FIG. 2 shows only two rows of subgates and one offset laterally (in the X direction of FIG. 2) equal to approximately half the row to row spacing, a person skilled in the art will appreciate that more than two rows are possible and with distinct lateral spacing between subgates in each row and distinct sizes of each subgate 116*a-e*. In addition, while FIG. 2 shows the shape of the subgates 116*a-e* as rectangular, this is not to imply a limitation. Subgates 116*a-e* may have a circular, elliptical, oval or other shape when viewed from above. In particular, the shape of a subgate, when viewed from above, would preferably not have any corners.

Figure 3:
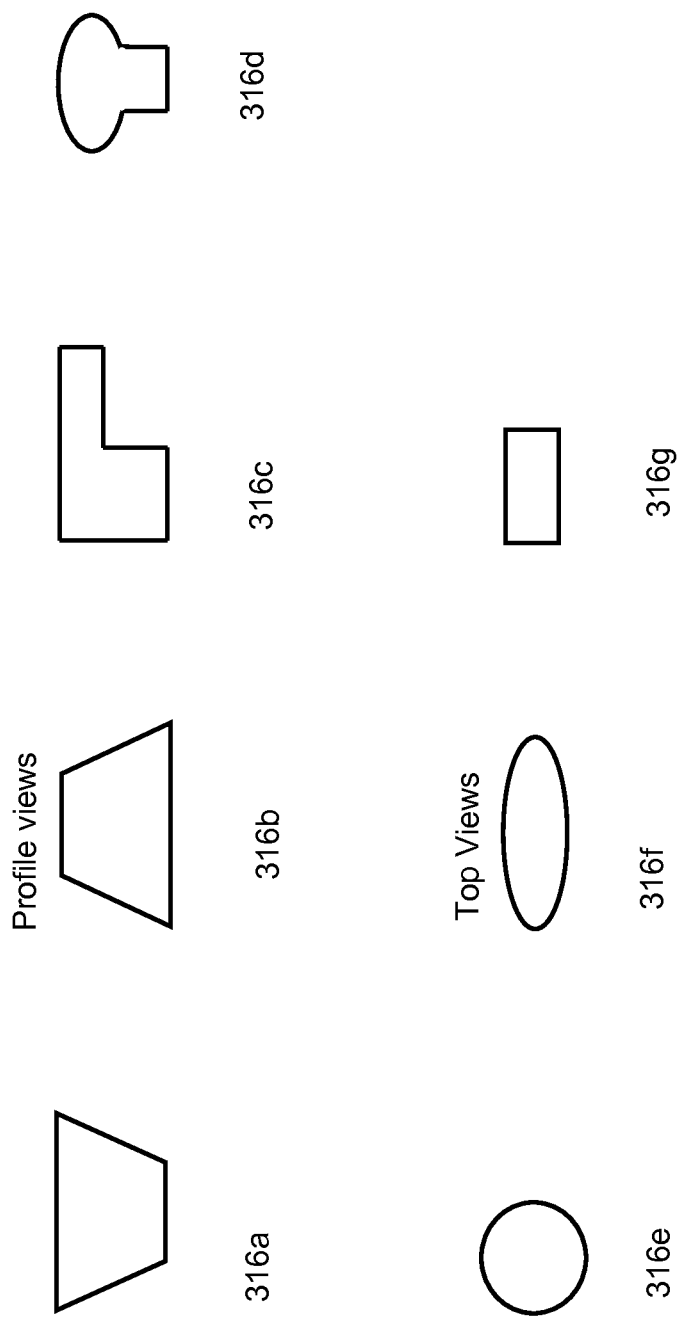
FIG. 3 Example of subgate profiles (a-d) and top views (e-g).

FIG. 3 shows various subgate profiles in 316*a* through 316*d* by way of example and not limitation. Similarly 316*e* through 316*g* shows various subgate top views, again by way of example and not limitation. The various profiles may be matched with various top views.

Figure 4:
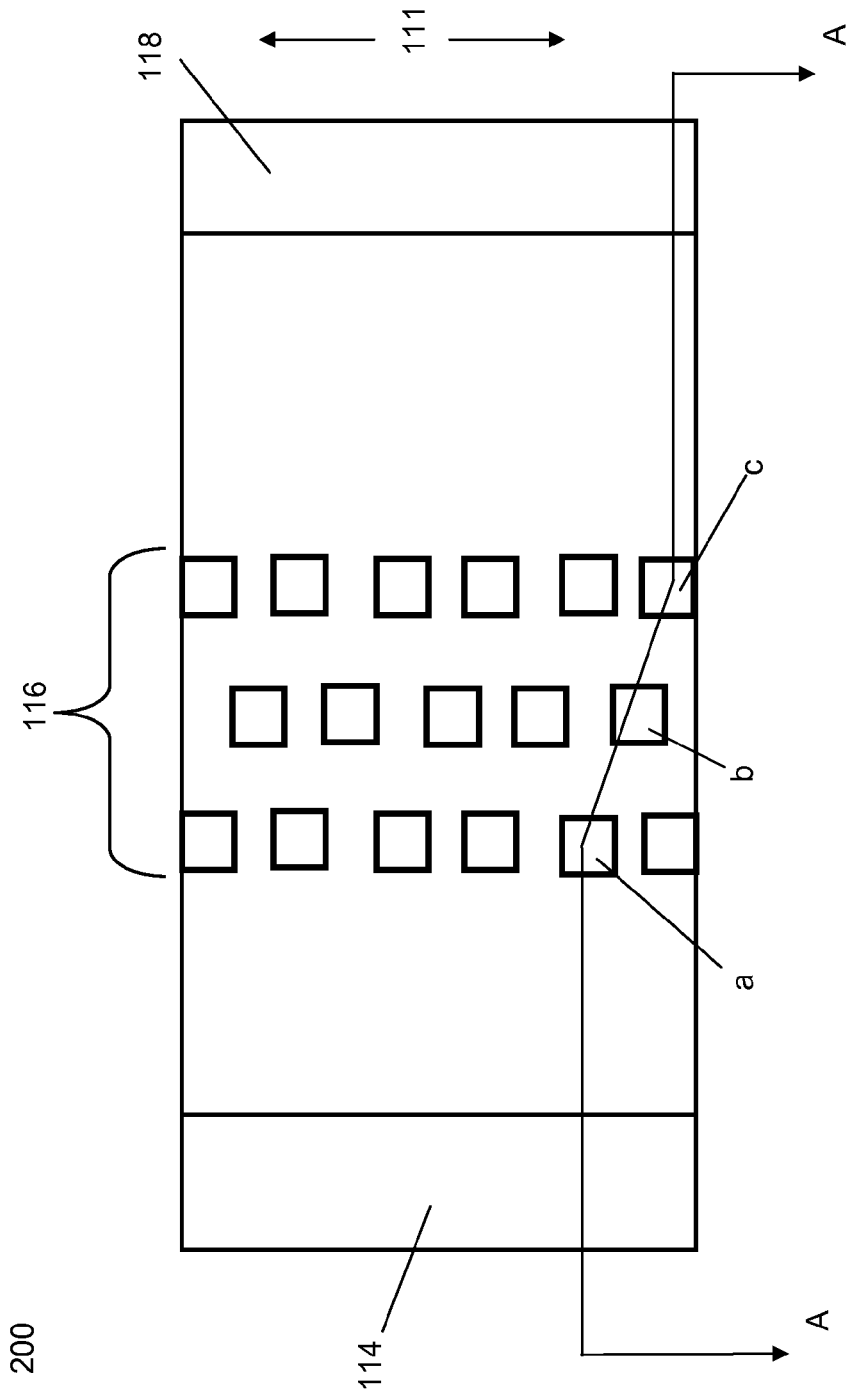
FIG. 4: Top view of a HEMT using numerous subgates and the section A-A shown in FIG. 5.

FIG. 4 shows a HEMT device 200 with three rows of subgates and the orientation of Section A-A. The lateral dimension is marked as 111 in FIG. 4. Three subgates a, b and c of gate 116 are marked. Although all the subgates shown in FIG. 4 are electrically connected to each other, that connection is not illustrated in FIG. 4 for clarity. The section A-A in FIG. 4 is shown in profile in FIG. 5.

FIG. 5 shows the device 200. Device 200 comprises a substrate 107 which may be silicon, a nucleation layer 108, a buffer layer 109, a channel layer 110 and a barrier layer 112. The device 200 in FIG. 5 may further comprise a backside metal layer 106, a source field plate 115, a drain plate 119 and an insulator 117. The device 200 is completed with a source 114 and a drain 118. FIG. 5 is a section A-A of the device 200 in FIG. 4. The gate 116 comprises subgates a, b and c (and others) as well as a top plate electrically connecting the subgates.

Although practiced with GaN materials, this is not to imply a limitation. The techniques and methods above may be practiced with other combination of a Group III material and Group V materials. Typical Group III materials include Gallium and Indium. Group V materials include Nitrogen, Phosphorus, Arsenic, and Antimony. Channel layer materials include, by way of example and not limitation, GaN, InGaN and AlInGaN. Alternative Barrier layer materials include, by way of example and not limitation, AlN, AlInN, AlGaN, and AlInGaN.

The Channel and Barrier layers have been described as single homogeneous layers, by example only, and not to imply a limitation. The various layers described may comprise multiple layers of the materials described above.

While the invention has been described in connection with certain exemplary embodiments, it is to be understood by those skilled in the art that the invention is not limited to the disclosed embodiments, but, on the contrary, is intended to cover various modifications included within the spirit and scope of the appended claims and equivalents thereof.

What is claimed is:

1. A HEMT device comprising:
   a channel layer and a barrier layer;
   a source, gate and drain disposed on the barrier layer;
   wherein the gate comprises a plurality of physically distinct subgates arranged in a plurality of rows, each row having a plurality of subgates;
   wherein the subgates are electrically connected into at least one group; and
   wherein the subgates in each row are staggered relative to an adjacent row of subgates such that there is at least one subgate in each row that when the subgate is projected toward the adjacent row, the projection of the subgate would overlap with at least one subgate and an opening between subgates in the adjacent row.

2. The device of claim 1 wherein the subgates are in rows separated by approximately 0.1 micrometer and each subgate has an area, when viewed from above, that is at least the area of a 0.05 micrometer radius circle.

3. The device of claim 1 wherein the subgates are electrically connected with a field plate.

4. The device of claim 1 wherein the channel layer comprises a Group III-V material.

5. The device of claim 1 wherein the channel layer comprises GaN.

6. The device of claim 1, wherein each row defines a first gap between subgates in the row, the gap being misaligned with a second gap in the adjacent row.

7. The device of claim 1, wherein each row includes at least three subgates.

8. The device of claim 1, wherein each row includes at least four subgates.

9. The device of claim 1, wherein each row extends along a direction, and each subgate extends along the direction beyond an adjacent subgate in an adjacent row.

10. The device of claim 1, wherein the projection of the subgate would overlap with at least two subgates and the opening between subgates in the adjacent row.

11. The device of claim 1, wherein the subgates in each row are staggered relative to an adjacent row of subgates such that there are least two subgates in each row that when the two subgates are projected toward the adjacent row, the projection of the two subgates would overlap with at least three subgates and two openings between subgates in the adjacent row.

12. The device of claim 1, wherein the subgates in each row are staggered relative to an adjacent row of subgates such that there are least three subgates in each row that when the three subgates are projected toward the adjacent row, the projection of the three subgates would overlap with at least five subgates and three openings between subgates in the adjacent row.

13. A HEMT device comprising:
   a channel layer and a barrier layer;
   a source, gate and drain disposed on the barrier layer;
   wherein the source has a length and the source is spaced apart from the drain by a width;
   wherein the gate comprises a plurality of physically distinct subgates arranged in a plurality of rows, each row having a plurality of subgates;
   wherein the subgates in each row are staggered relative to an adjacent row of subgates such that there is at least one subgate in each row that when the subgate is projected toward the adjacent row, the projection of the subgate would overlap with at least one subgate and an opening between subgates in the adjacent row;
   wherein the plurality of rows are disposed between the source and the drain.

* * * * *